United States Patent
Ueta

(10) Patent No.: US 12,520,657 B2
(45) Date of Patent: Jan. 6, 2026

(54) LIGHT-EMITTING ELEMENT AND METHOD FOR PRODUCING LIGHT-EMITTING ELEMENT

(71) Applicant: SHARP KABUSHIKI KAISHA, Sakai (JP)

(72) Inventor: Yoshihiro Ueta, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 599 days.

(21) Appl. No.: 17/922,627

(22) PCT Filed: May 8, 2020

(86) PCT No.: PCT/JP2020/018686
§ 371 (c)(1),
(2) Date: Apr. 17, 2023

(87) PCT Pub. No.: WO2021/224993
PCT Pub. Date: Nov. 11, 2021

(65) Prior Publication Data
US 2023/0247847 A1  Aug. 3, 2023

(51) Int. Cl.
*H10K 50/17* (2023.01)
*H10K 50/115* (2023.01)
*H10K 71/00* (2023.01)
*H10K 102/00* (2023.01)

(52) U.S. Cl.
CPC ........... *H10K 50/17* (2023.02); *H10K 50/115* (2023.02); *H10K 50/171* (2023.02); *H10K 71/00* (2023.02); *H10K 2102/351* (2023.02)

(58) Field of Classification Search
CPC .... H10K 50/17; H10K 50/115; H10K 50/171; H10K 71/00
See application file for complete search history.

(56) References Cited

U.S. PATENT DOCUMENTS

| | | | |
|---|---|---|---|
| 2006/0022585 A1 | 2/2006 | Aziz | |
| 2007/0194694 A1 | 8/2007 | Reddy | |
| 2009/0072723 A1 | 3/2009 | Shioya | |
| 2010/0320442 A1 | 12/2010 | Reddy | |
| 2013/0020550 A1 | 1/2013 | Reddy | |
| 2013/0234121 A1* | 9/2013 | Sonoyama | H10K 71/233 438/34 |
| 2015/0144895 A1* | 5/2015 | Joo | H10K 50/15 257/40 |

(Continued)

FOREIGN PATENT DOCUMENTS

| CN | 104218166 A | * 12/2014 | ......... H10K 85/6572 |
|---|---|---|---|
| CN | 109545996 A | 3/2019 | |

(Continued)

OTHER PUBLICATIONS

CN-104218166-A, machine translation (Year: 2014).*

*Primary Examiner* — Tracie Y Green
(74) *Attorney, Agent, or Firm* — ScienBiziP, P.C.

(57) ABSTRACT

A light-emitting element, includes: an anode; a cathode facing the anode; a light-emitting layer provided between the anode and the cathode, and containing a phosphor; and at least one intermediate layer provided between the anode and the light-emitting layer, and containing at least one of oxide of a metal or hydroxide of the metal.

1 Claim, 2 Drawing Sheets

(56) References Cited

U.S. PATENT DOCUMENTS

2015/0380653 A1* 12/2015 Liu ..................... H10H 20/812
 438/35
2017/0250363 A1* 8/2017 Baumann ............. H10K 85/361
2021/0317326 A1* 10/2021 Doherty ............... G02B 6/0053

FOREIGN PATENT DOCUMENTS

| JP | 2006049906 A | 2/2006 |
| JP | 2006302637 A | 11/2006 |
| JP | 2009060012 A | 3/2009 |
| JP | 2009088276 A | 4/2009 |
| JP | 2009527876 A | 7/2009 |
| JP | 2016206550 A | 12/2016 |
| JP | 2020045440 A | 3/2020 |

* cited by examiner

FIG. 3

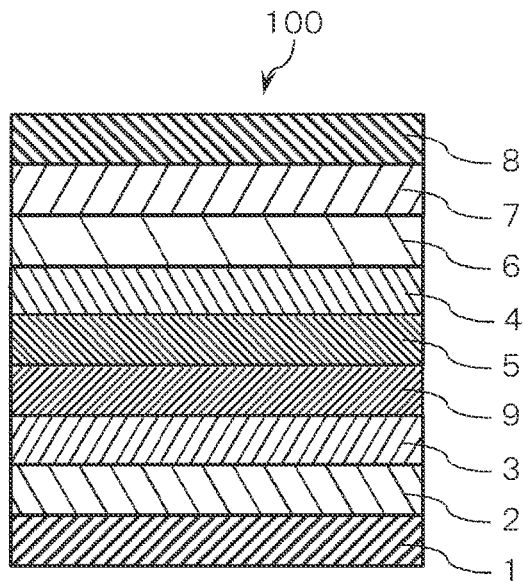

FIG. 4

|  | HIGH POLAR LIQUID | METAL LAYER | COMPONENT OF INTERMEDIATE LAYER | THICKNESS OF INTERMEDIATE LAYER(nm) | RELIABILITY |
|---|---|---|---|---|---|
| EXAMPLE 1 | ETHYLENE CARBONATE | Ni | $Ni(OH)_2$ $NiOOH-NiON_2$ | 3 | ○ |
| COMPARATIVE EXAMPLE 1 | ETHYLENE CARBONATE | – | – | – | × |
| COMPARATIVE EXAMPLE 2 | – | Ni | – | – | × |
| EXAMPLE 2-1 | PROPYLENE CARBONATE | Ni | $Ni(OH)_2$ $NiOOH-NiON_2$ | 3 | ○ |
| EXAMPLE 2-2 | 1,2-DIMETHOXYETHANE | Ni | $Ni(OH)_2$ $NiOOH-NiON_2$ | 3 | ○ |
| EXAMPLE 2-3 | DIMETHYL CARBONATE | Ni | $Ni(OH)_2$ $NiOOH-NiON_2$ | 4 | ○ |
| EXAMPLE 2-4 | DIETHYL CARBONATE | Ni | $Ni(OH)_2$ $NiOOH-NiON_2$ | 4 | ○ |
| EXAMPLE 3-1 | ETHYLENE CARBONATE | Cr | $Cr(OH)$, $Cr(OH)_3$ | 3 | ○ |
| EXAMPLE 3-2 | ETHYLENE CARBONATE | Mg | $Mg(OH)_2$ | 3 | ○ |
| EXAMPLE 3-3 | ETHYLENE CARBONATE | Fe | $Fe_2O_3$ | 3 | ○ |
| EXAMPLE 3-4 | ETHYLENE CARBONATE | Zn | $Zn(OH)_2$ | 3 | ○ |
| EXAMPLE 3-5 | ETHYLENE CARBONATE | Sn | $Sn(OH)_2$, $SnOOH$ | 3 | ○ |
| EXAMPLE 3-6 | ETHYLENE CARBONATE | Cu | $Cu_2O$, $Cu_2(OH)_2$ | 3 | ○ |
| EXAMPLE 4 | ETHYLENE CARBONATE | Al | $Al(OH)_3$ | 2 | ○ | ns
LIGHT-EMITTING ELEMENT AND METHOD FOR PRODUCING LIGHT-EMITTING ELEMENT

TECHNICAL FIELD

The disclosure relates to a light-emitting element and a method for producing the light-emitting element.

BACKGROUND ART

For example, Patent Document 1 discloses a light-emitting element including: an anode; a hole-transport layer; a light-emitting layer containing quantum dots; an electron-transport layer; and a cathode, all of which are stacked in the stated order. Mobility of holes in the hole-transport layer is lower than mobility of electrons in the electron-transport layer, and the hole-transport layer is capable of blocking the electrons.

CITATION LIST

Patent Literature

[Patent Document 1] Japanese Unexamined Patent Application Publication No. 2009-088276

SUMMARY

Technical Problem

However, in the light-emitting element described in Patent Document 1, the electrons are not kept from moving to the hole-transport layer, and the hole-transport layer could deteriorate by the electrons. A main object of the present disclosure is to provide a highly reliable light-emitting element in which such a functional layer as, for example, a hole-transport layer is kept from deteriorating.

Solution to Problem

A light-emitting element according to an aspect of the disclosure includes: an anode; a cathode facing the anode; a light-emitting layer provided between the anode and the cathode, and containing a phosphor, and at least one intermediate layer provided between the anode and the light-emitting layer, and containing at least one of oxide of a metal or hydroxide of the metal.

BRIEF DESCRIPTION OF DRAWINGS

FIG. 3 is a view of another exemplary multilayer structure of the light-emitting element.

FIG. 4 is a table showing, for example, results of Examples and Comparative Examples.

DESCRIPTION OF EMBODIMENT

Described below is an embodiment of the present disclosure.

Figure 1:
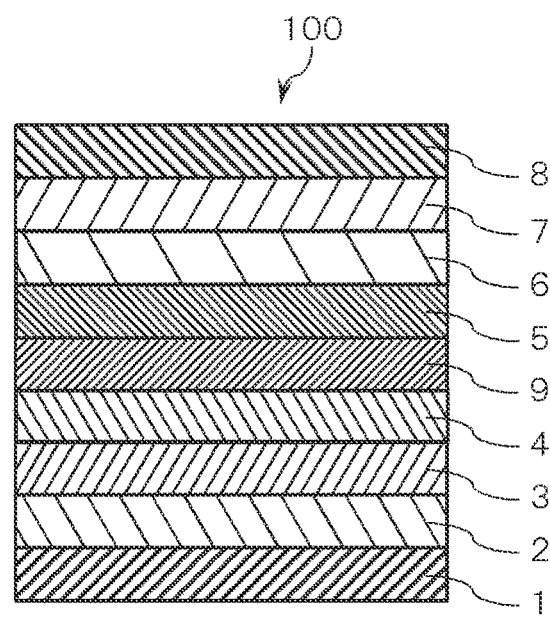
FIG. 1 is a view of an exemplary multilayer structure of a light-emitting element according to an embodiment.

FIG. 1 is a schematic view of an exemplary multilayer structure of a light-emitting element 100 according to this embodiment.

As illustrated in FIG. 1, the light-emitting element 100 includes, for example: a substrate 1; an anode 2; a hole-injection layer 3; a hole-transport layer 4; an intermediate layer 5; a metal layer 9; a light-emitting layer 6; an electron-transport layer 7; and a cathode 8. Then, the light-emitting element 100 has a structure in which, for example, the anode 2, the hole-injection layer 3, the hole-transport layer 4, the intermediate layer 5, the light-emitting layer 6, the electron-transport layer 7, and the cathode 8 are stacked one another on the substrate 1 in the stated order.

The substrate 1 is made of, for example, glass, and functions as a support body to support each of the above layers. The substrate 1 may be an array substrate provided with, for example, thin-film transistors (TFTs).

The anode 2 supplies the light-emitting layer 6 with holes. Moreover, the anode 2 is provided to face the cathode 8.

The cathode 8 supplies the light-emitting layer 6 with electrons.

Either the anode 2 or the cathode 8 is made of a light-transparent material. Note that either the anode 2 or the cathode 8 may be made of a light-reflective material. If the light-emitting element 100 is a top-emission light-emitting element, for example, the cathode 8 provided above is formed of a light-transparent material and the anode 2 provided below is formed of a light-reflective material. Moreover, if the light-emitting element 100 is a bottom-emission light-emitting element, for example, the cathode 8 provided above is formed of a light-reflective material and the anode 2 provided below is formed of a light-transparent material. Furthermore, either the anode 2 or the cathode 8 may be a multilayer stack of a light-transparent material and a light-reflective material, so that the electrode may be light-reflective.

The light-transparent material may be, for example, a transparent conductive material. Specific examples of the light-transparent material can include: indium tin oxide (ITO); indium zinc oxide (IZO); tin oxide ($SnO_2$), aluminum zinc oxide (AZO); and f-doped tin oxide (FTO). These materials are high in transmittance of visible light, and improve emission efficiency of the light-emitting element 100.

The light-reflective material may be, for example, a metal material. Specific examples of the light-reflective material can include: aluminum (Al); silver (Ag); copper (Cu); and gold (Au). These materials are high in reflectance of visible light, and improve emission efficiency of the light-emitting element 100. Note that an appropriate cathode material exhibits a high work function close to a Fermi level or a LUMO of the electron-transport layer. The cathode material is such a metal as Ag or Mg, or such a ZnO-based compound as IZO. If the light is released from toward the cathode, the cathode is desirably as thin as approximately 50 nm or less, so that absorption of the light with the cathode is reduced and external quantum efficiency is improved.

The light-emitting layer 6 contains such a light-emitting material as, for example, a phosphor. Then, the light-emitting layer 6 emits light by recombination of the holes transported from the anode 2 and the electrons transported from the cathode 8.

An example of the light-emitting material includes quantum dots. The quantum dots are semiconductor fine particles having a particle size of, for example, 100 nm or less. The quantum dots may be: crystals of such a II-VI semiconductor compound as MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe, or HgTe; and/or crystals of such a III-V semiconductor compound as GaAs, GaP, InN, InAs, InP, or InSb; and/or crystals of such a IV semiconductor compound as Si or Ge. Moreover, the quantum dots may have a core/shell structure in which, for example, the above semiconductor crystals serving as cores are coated with a shell material having a wide bandgap. More specifically, the semiconductor fine particles may have a core/shell structure including: a core made of a II-VI compound such as CdSe or CdSeTe, a III-V compound such as InP or InN, or a perovskite; and a shell made of ZnS or GaN. Furthermore, the semiconductor fine particles have a surface preferably modified with such a typical ligand as ethanolamine or oleic acid, so that the semiconductor fine particles disperse into the solvent and a surface defect of the semiconductor fine particles is inactivated. The solvent is such an organic solvent as octane and hexadecylamine. This solvent can be used as a dispersion medium of a coating fluid containing the semiconductor fine particles.

Moreover, the light-emitting layer 6 contains, for example, a high polar liquid. This high polar liquid can improve mobility of carriers such as the electrons and the holes in the light-emitting layer 6. Examples of the high polar liquid include: a carbonate-based solvent, an ethoxy-based solvent; a thiol-carboxyl-based solvent; a thiol-amine-based solvent; a carboxyl-amine-based solvent; a ketone-based solvent; a nitrile-based solvent; and a lactone-based solvent. Moreover, a specific example of the high polar liquid is at least one selected from: propylene carbonate; ethylene carbonate; 1,2-dimethoxyethane; dimethyl carbonate; diethyl carbonate; mercaptopropionic acid; cysteamine; and mercaptoacetic acid. Furthermore, if the high polar liquid includes a ligand serving as a light-emitting material and having a surface on which polarity is coordinated, mercaptopropionic acid, cysteamine, or mercaptoacetic acid is preferable as the high polar liquid. In particular, ethylene carbonate is suitable as the high polar liquid.

The light-emitting layer 6 can be formed by various kinds of known techniques such as, for example, application. In this embodiment, particularly preferable application involves applying a coating liquid containing a light-emitting material and a solvent to form the light-emitting layer 6. If the high polar liquid is used as a solvent for forming the light-emitting layer 6, the high polar liquid can be readily contained in the light-emitting layer 6. The light-emitting layer 6 preferably has a thickness of approximately, for example, 40 nm.

The hole-transport layer 4 transports the holes, supplied from the anode 2, to the light-emitting layer 6. The hole-transport layer 4 is provided between the anode 2 and the light-emitting layer 6. The hole-transport layer 4 contains a hole-transporting material.

Examples of the hole-transporting material include: a material containing one or more substances selected from a group consisting of an oxide, a nitride, or a carbide containing one or more of Zn, Cr, Ni, Ti, Nb, Al, Si, Mg, Ta, Hf, Zr, Y, La, or Sr; a material such as 4,4',4"-tris(9-carbazolyl)-triphenylamine (TCTA), 4,4'-bis[N-(1-naphthyl)-N-phenylamino]-biphenyl (NPB), zinc phthalocyanine (ZnPC), di-[4-(N,N-ditolylamino)-phenyl]cyclohexane (TAPC), 4,4'-bis(carbazol-9-yl)biphenyl (CBP), 2,3,6,7,10,11-hexacyano-1,4,5,8,9,12-hexaazatriphenylene (HATCN), or $MoO_3$; and a hole-transport organic material such as poly (N-vinylcarbazole)(PVK), poly(2,7-(9,9-di-n-octylfluorene)-(1,4-phenylene-((4-sec-butylphenyl)imino)-1,4-phenylene (TFB), a poly(triphenylamine) derivative (Poly-TPD), or poly(3,4-ethylenedioxythiophene) poly(4-styrene sulfonate) (PEDOT:PSS).

The hole-injection layer 3 is provided, for example, between the anode 2 and the hole-transport layer 4. The hole-injection layer 3 encourages injection of the holes from anode 2 to the hole-transport layer 4. The hole-injection layer 3 contains a hole-transporting material. This hole-transporting material is the same as the hole-transporting material used for the hole-transport layer 4. Note that the hole-injection layer 3 is not essential, and may be omitted depending on a desired structure and characteristics of the light-emitting element. In particular, for example, if the hole-injection layer is formed of an inorganic material, there is no problem with omitting the hole-injection layer.

The intermediate layer 5 is provided, for example, between the light-emitting layer 6 and the hole-transport layer 4. The intermediate layer 5 contains oxide and hydroxide of a metal. In particular, the intermediate layer 5 preferably contains hydroxide of a metal. Moreover, examples of the metal to be used for the intermediate layer 5 include at least one selected from, for example, Mg, Al, Zn, Fe, Ni, Sn, Cu, and Cr. In particular, Ni is preferable as the metal.

The intermediate layer 5 is formed of oxide or hydroxide of at least one metal selected from, for example, Mg, Al, Zn, Fe, Ni, Sn, Cu, and Cr. In particular, the intermediate layer 5 is preferably made of hydroxide of the at least one metal. Furthermore, the at least one metal is preferably Ni.

In addition, examples of the hydroxide of the metals include: $Ni(OH)_2$, $Mg(OH)_2$, $Al(OH)_3$, $Zn(OH)_2$, $Sn(OH)_2$, $Sn_2(OH)_2$, $Cr(OH)$, and $Cr(OH)_3$. Moreover, examples of the oxide of the metals include: $Fe_2O_3$, $CuzO$, and $Cr_2O_3$. Furthermore, for example, the oxide and the hydroxide of the metals may be a peroxide such as NiOOH or SnOOH, a complex of oxide and hydroxide containing such a peroxide as $NiOOH-NiO_2$, and a complex of hydroxide containing peroxide.

As can be seen, the intermediate layer 5 can reduce deterioration of the hole-transport layer 4. This is possibly because the intermediate layer 5 reduces the move of the electrons from toward the light-emitting layer 6 to the hole-transport layer 4, such that the hole-transport layer 4 is less likely to deteriorate by the electrons. In particular, if the hole-transport layer 4 is made of an organic substance, the deterioration can be further reduced.

The intermediate layer 5 has an exemplary thickness of preferably 1 nm or more and 5 nm or less, and, more preferably, 1 nm or more and 3 nm or less. Such a feature can reduce the move of the electrons from toward the light-emitting layer 6 to the hole-transport layer 4, and reduce a decrease in efficiency in transporting the holes from the hole-transport layer 4 to the light-emitting layer 6.

The metal layer 9 is provided, for example, between the intermediate layer 5 and the hole-transport layer 4. Moreover, the metal layer 9 is adjacent to the intermediate layer 5.

The metal layer 9 is made of at least one metal selected from, for example, Mg, Al, Zn, Fe, Ni, Sn, Cu, and Cr. The metal of the metal layer 9 is preferably the same as the metal used for the intermediate layer.

The metal layer 9 preferably has a thickness of, for example, 5 nm or less. If the metal layer 9 has a thickness of more than 5 nm, the excessive thickness could block transportation of the holes from the hole-transport layer 4 to the light-emitting layer 6. Moreover, the metal layer 9 has a minimum thickness of preferably 1 nm or more. In some cases, the metal layer 9 may be either divided into islands or omitted.

The electron-transport layer 7 transports the electrons to the light-emitting layer 6. The electron-transport layer 7 is provided between the cathode 8 and the light-emitting layer 6. Moreover, the electron-transport layer 7 may also function to block transportation of the holes. Furthermore, the electron-transport layer 7 may also function to encourage injection of the electrons from the cathode 8 into the light-emitting layer 6. Note that the light-emitting element 100 may also include, for example: a layer between the electron-transport layer 7 and the light-emitting layer 6 to block transportation of the holes; and a layer between the cathode 8 and the electron-transport layer 7 to encourage injection of the electrons from the cathode 8 into the light-emitting layer 6.

The electron-transport layer 7 is made of an electron-transporting material such as, for example, zinc oxide (e.g. ZnO), titanium oxide (e.g. $TiO_2$), or strontium titanate oxide (e.g. $SrTiO_3$). Either one kind of these electron-transporting materials alone may be used, or two or more of these electron-transporting materials may be appropriately used in combination.

The electron-transport layer 7 can be formed by various kinds of known techniques such as, for example, vacuum vapor deposition, sputtering, and application. The electron-transport layer 7 may be made of a material including: a ZnO-based compound such as IZO or ZAO; an inorganic compound such as $MoO_3$, $WO_3$, or LiF; and tris(8-hydroxyquinolinato)aluminium ($Alq_3$).

Figure 2:
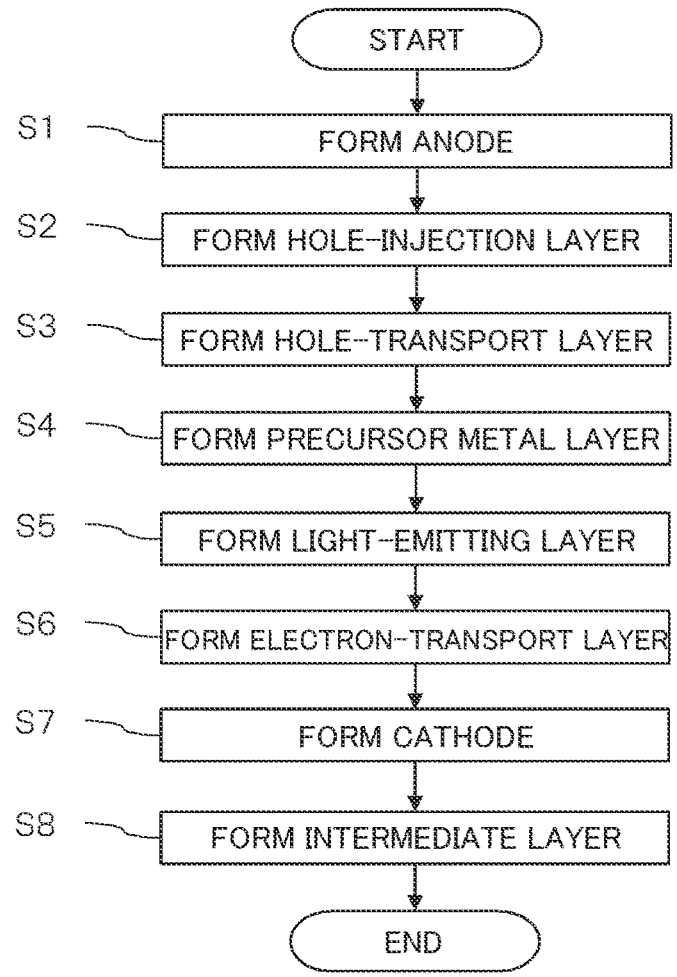
FIG. 2 is a flowchart showing an exemplary production of the light-emitting element according to the embodiment.

Described below is an exemplary method for producing the light-emitting device 100 according to this embodiment, with reference to FIGS. 1, 2, and 3. In this production method, the light-emitting layer has a predetermined pattern.

First, as illustrated in FIG. 1, the anode 2 is formed on the substrate 1 (S1). The anode 2 can be formed of various kinds of known techniques such as, for example, sputtering or vacuum vapor deposition.

On the anode 2, the hole-injection layer 3 is formed (S2). The hole-injection layer 3 can be formed by various kinds of known techniques such as, for example, vacuum vapor deposition, sputtering, or application.

On the hole-injection layer 3, the hole-transport layer 4 is formed (S3). The hole-transport layer 4 can be formed by various kinds of known techniques such as, for example, vacuum vapor deposition, sputtering, or application. More specifically, for example, the hole-transport layer 4 may be formed of typical organic and inorganic materials such as PVK, TFB, $MoO_3$, and $WO_3$ by vapor deposition or sputtering. Alternatively, the hole-transport layer 4 may be formed by applying and firing a precursor solution of each of the materials, or in particular, a colloidal solution in which inorganic nanoparticles are dispersed.

On the hole-transport layer 4, a precursor metal layer is formed (S4). The precursor metal layer can be formed of various kinds of known techniques such as, for example, vacuum vapor deposition or sputtering. The precursor metal layer does not have to be a continuous film, and may be, for example, divided into islands. The thickness of the precursor metal layer divided into islands means an average thickness. Even if divided into islands, the precursor metal layer diffuses horizontally in plane. That is why the intermediate layer (a passivation film) 5 can be continuously formed.

Moreover, the precursor metal layer is made of a material capable of forming the metal layer 9 and the intermediate layer 5. Such a material is at least one metal selected from, for example, Mg, Al, Zn, Fe, Ni, Sn, Cu, and Cr. In particular, Al is preferable as a material of the precursor metal layer. Al is well known to be highly susceptible to oxidation; however, under an environment in which $OH^-$ is found, Al preferentially forms hydroxide. $OH^-$ is most oxidative in the reactive oxygen family including $O^-$. Hence, if Al, which is susceptible to oxidation, is found, $OH^-$ prevails over $O^-$ in bonding with Al, forms a kind of passivation; namely, aluminum hydroxide, and becomes stabilized. Such a property is widely taken advantage of as a technique to form a tough passivation protection film by, for example, alumite treatment to protect an Al product from oxidation. As seen in alumite treatment, Al in Examples produces aluminum hydroxide to form the intermediate layer (the passivation film) 5. Such a feature can improve reliability of the light-emitting element.

On the precursor metal layer, the light-emitting layer 6 is formed (S5). The light-emitting layer 6 is preferably formed of, for example, application. Moreover, for example, the light-emitting layer 6 can be formed as follows: A coating fluid is prepared to contain a high polar liquid, a solvent, and a light-emitting material. This coating fluid is either applied to, or ink-jet printed on, the precursor metal layer. The coating fluid is heat-treated and the solvent is vaporized, so that the light-emitting layer 6 is formed. Note that the temperature of the heat treatment is preferably 150° C. or below in consideration of damage to the semiconductor fine particles. Moreover, in the heat treatment, a steam pressure of the high polar liquid is one-thousandths as low as a steam pressure of the solvent. That is why the high polar liquid can remain in the light-emitting layer 6 even after the heat treatment. Note that, preferably, the coating fluid is applied to the precursor metal layer and, after that, baked at a temperature below the boiling point of the high polar liquid, so that the high polar liquid remains in the light-emitting layer 6. Note that the high polar liquid contained in the coating liquid is adjusted to 1 mass percent or more and 90 mass percent or less, so that the light-emitting layer 6 can be formed. Moreover, for example, the coating liquid may be photosensitive, and the light-emitting layer 6 may be formed by photolithography.

On the light-emitting layer 6, the electron-transport layer 7 is formed (S6). The electron-transport layer 7 can be formed by various kinds of known techniques such as, for example, vacuum vapor deposition, sputtering, or application.

On the electron-transport layer 7, the cathode 8 is formed (S7). The cathode 8 can be formed of various kinds of known techniques such as, for example, sputtering or vacuum vapor deposition.

Moreover, a current is applied between the anode 2 and the cathode 8, so that the intermediate layer is formed in the precursor metal layer either toward the light-emitting layer 6 or toward the hole-transport layer 4. The intermediate layer contains oxide and/or hydroxide of a metal contained in the precursor metal layer. The reaction of the precursor metal layer to form the oxide and/or the hydroxide of the metal is caused by, for example, electrochemical reaction.

For example, when the intermediate layer is formed in the precursor metal layer toward the light-emitting layer 6, a current is applied to move the high polar liquid, contained in the light-emitting layer 6, to the interface between the metal layer and the light-emitting layer 6, such that, probably, the high polar liquid and the metal of the precursor metal layer react to form the oxide and/or the hydroxide of the metal, which will serve as the intermediate layer.

Note that, as described above, the high polar liquid is adjusted so that not all the precursor metal layer undergoes the reaction. Hence, a multilayer stack can be formed to include the intermediate layer 5 and the metal layer 9.

Moreover, when all the precursor metal layer undergoes the reaction, all the precursor metal layer can be transformed to the intermediate layer 5.

Furthermore, for example, when the intermediate layer 5 is formed in the precursor metal layer toward the hole-transport layer 4, the high polar liquid is previously contained in the hole-transport layer. A current is applied to move the high polar liquid, contained in the hole-transport layer 4, to the interface between the metal layer and the light-emitting layer 6, such that, probably, the high polar liquid and the metal of the precursor metal layer react to form the oxide and/or the hydroxide of the metal, which will serve as the intermediate layer 5. Note that, as seen the above, if the intermediate layer 5 and the metal layer 9 form a multilayer stack, the stacking order is reversed such that the intermediate layer 5 is provided toward the hole-transport layer 4 and the metal layer 9 is provided toward the light-emitting layer 6.

Hence, the light-emitting element 100 is successfully produced.

In the light-emitting element according to this embodiment, at least one intermediate layer is provided between the hole-transport layer 4 and the light-emitting layer 6. The intermediate layer contains at least one of oxide of a metal or hydroxide of the metal. The intermediate layer can reduce move of the electrons from toward the light-emitting layer to the hole-transport layer 4. Such a feature can reduce deterioration of the hole-transport layer 4 caused by the electrons, and improve reliability of the light-emitting element.

Note that, in the above example, the intermediate layer 5 and the metal layer 9 are provided between the light-emitting layer 6 and the hole-transport layer 4 serving as a functional layer. However, this embodiment shall not be limited to such an example. For example, the intermediate layer 5 and the metal layer 9 are provided toward the light-emitting layer 6 serving as a functional layer. Such a feature can reduce deterioration of the functional layer. For example, the hole-injection layer 3 and the anode 2 can also serve as functional layers. The intermediate layer 5 and the metal layer 9 may be provided to these layers toward the light-emitting layer 6. For example, as illustrated in FIG. 3, the intermediate layer 5 and the metal layer 9 may be provided between the hole-transport layer 4 and the hole-injection layer 3. Such a feature can reduce deterioration of the hole-injection layer 3. Moreover, the intermediate layer 5 and the metal layer 9 may be provided between the light-emitting layer 6 and the hole-transport layer 4, and between the hole-transport layer 4 and the hole-injection layer 3.

Example 1

On a glass substrate, an anode having a thickness of 30 nm was formed of ITO by sputtering.

On the anode, PEDOT-PSS was applied to form a hole-injection layer having a thickness of 20 nm.

On the hole-injection layer, a hole-transport layer having a thickness of 40 nm was formed of TFB.

On the hole-transport layer, a precursor metal layer having a thickness of 3 nm was formed of Ni by sputtering.

To the precursor metal layer, a mixture solution, which contains semiconductor nanoparticles whose core was CdSe and whose shall was ZnS, ethylene carbonate serving as a high polar liquid, and octane serving as a solvent, was applied to form a light-emitting layer.

To the light-emitting layer, a colloidal solution in which inorganic nanoparticles were dispersed was applied to form an electron-transport layer having a thickness of 50 nm.

On the electron-transport layer, Al having a thickness of 10 nm was vapor-deposited to form a cathode.

Next, a current was applied between the anode and the cathode, so that a portion of the precursor metal layer facing the light-emitting layer electrochemically reacted to form an intermediate layer. The precursor metal layer became a multilayer stack of the intermediate layer and a metal layer.

Hence, a light-emitting element was produced. Note that details of the formed intermediate layer, such as components and thicknesses of the intermediate layer, are shown in the table in FIG. 4.

Comparative Example 1

A light-emitting element was produced in the same manner as Example 1, except that the precursor metal layer was not formed; that is, nether the intermediate layer nor the metal layer was formed.

Comparative Example 2

A light-emitting element was produced in the same manner as the first example, except that the high polar liquid of a coating fluid for the light-emitting layer was replaced with tetrahydrofuran.

Examples 2-1 to 2-4

As shown in the table in FIG. 4, light-emitting elements were prepared in the same manner as Example 1, except that the high polar liquid of a coating fluid for the light-emitting layer was replaced with propylene carbonate, 1,2-dimethoxyethane, dimethyl carbonate, and diethyl carbonate.

Examples 3-1 to 3-6

As shown in the table in FIG. 4, light-emitting elements were prepared in the same manner as Example 1, except that the precursor metal layer was made of Cr, Mg, Fe, Zn, Sn, or Cu.

Fourth Example

A light-emitting element was prepared in the same manner as Example 1, except that the precursor metal layer was made of Al.

Evaluation

As to the light-emitting elements of Examples and Comparative Examples, the current density was adjusted to be kept constant at 20 mA/cm$^2$, and the luminance was measured with respect to an elapsed time period. Then, if the elapsed time period was less than 10000 hours until the luminance fell to 95% or below with respect to the initial luminance, the light-emitting element was evaluated as unworkable (NO). If the elapsed time period was 10000 hours or longer, the light-emitting element was evaluated as workable (YES). Here, the drive current density adopted was twice as high as a current density calculated from: a value of a typical current to be supplied from a TFT circuit driving a display panel; and a pixel size assumed of a 50-inch display panel having a resolution of 4 k. The reason why the drive current density is doubled is to compare reliability of the light-emitting elements not under an average drive condition but under a maximum drive condition, which is more severe. A current value under this condition is approximately 16 mA.

Note that the light-emitting element of Example 1 was particularly excellent because its luminance kept 97% of the initial luminance or above even after the elapse of 10000 hours.

The disclosure shall not be limited to the above embodiment, and may be replaced with substantially the same configuration as the configuration described in the embodiment, a configuration having the same advantageous effects, or a configuration capable of achieving the same object as that of the configuration in the embodiment.

The invention claimed is:

1. A method for producing a light-emitting element, the method comprising:
    forming a metal layer on an anode, the metal layer being made of a metal;
    applying a coating fluid to the metal layer and forming either a light-emitting layer or a functional layer, the coating fluid containing a high polar liquid;
    forming a cathode on either the light-emitting layer or the functional layer; and
    applying a current between the anode and the cathode and forming an intermediate layer in the metal layer either toward the light-emitting layer or toward the functional layer, the intermediate layer containing an oxide of the metal and/or a hydroxide of the metal.

* * * * *